(12) United States Patent
Lo et al.

(10) Patent No.: US 12,278,211 B2
(45) Date of Patent: Apr. 15, 2025

(54) MANUFACTURING METHOD OF SEMICONDUCTOR DEVICE

(71) Applicant: NANYA TECHNOLOGY CORPORATION, New Taipei (TW)

(72) Inventors: Yi-Jen Lo, New Taipei (TW); Hsih Yang Chiu, Taoyuan (TW); Ching Hung Chang, Taoyuan (TW); Chiang-Lin Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/491,813

(22) Filed: Oct. 23, 2023

(65) Prior Publication Data

US 2024/0055390 A1 Feb. 15, 2024

Related U.S. Application Data

(62) Division of application No. 17/198,252, filed on Mar. 11, 2021, now Pat. No. 11,842,979.

(51) Int. Cl.
*H01L 25/065* (2023.01)
*H01L 23/00* (2006.01)
*H01L 25/00* (2006.01)

(52) U.S. Cl.
CPC .............. *H01L 24/80* (2013.01); *H01L 24/08* (2013.01); *H01L 25/0657* (2013.01); *H01L 25/50* (2013.01); *H01L 2224/08146* (2013.01); *H01L 2224/8038* (2013.01); *H01L 2224/80894* (2013.01); *H01L 2225/06541* (2013.01); *H01L 2924/1436* (2013.01)

(58) Field of Classification Search
CPC ......... H01L 24/80; H01L 25/50; H01L 24/08; H01L 25/0657; H01L 2224/08146; H01L 2224/80894; H01L 2224/8038; H01L 2924/1436; H01L 2225/06541; H01L 24/05; H01L 2224/08058; H01L 2224/80006; H01L 2224/80379; H01L 2224/80896; H01L 2224/80895
See application file for complete search history.

(56) References Cited

U.S. PATENT DOCUMENTS

| | | | | |
|---|---|---|---|---|
| 2010/0264551 | A1* | 10/2010 | Farooq | H01L 25/50 438/109 |
| 2015/0243611 | A1* | 8/2015 | Liu | H01L 24/06 438/653 |
| 2018/0005977 | A1* | 1/2018 | Lin | H01L 21/76898 |
| 2020/0176466 | A1* | 6/2020 | Yang | H01L 25/50 |
| 2020/0402951 | A1* | 12/2020 | Chen | H01L 24/03 |
| 2021/0391376 | A1* | 12/2021 | Chen | H01L 23/5385 |

* cited by examiner

Primary Examiner — Thanh Y. Tran
(74) Attorney, Agent, or Firm — JCIPRNET

(57) ABSTRACT

The disclosure provides a method of manufacturing a semiconductor device including bonding a second device wafer to a first device wafer, such that a first bonding interface including a dielectric-to-dielectric bonding interface and a metal-to-metal bonding interface is formed between the first device wafer and the second device wafer, wherein the second device wafer is electrically coupled to the first device wafer, and a function of the first device wafer and the second device wafer are the same kind of device wafer. A semiconductor device is also provided.

7 Claims, 12 Drawing Sheets

US 12,278,211 B2

MANUFACTURING METHOD OF SEMICONDUCTOR DEVICE

CROSS-REFERENCE TO RELATED APPLICATION

This application is a divisional application of and claims the priority benefit of U.S. application Ser. No. 17/198,252 filed on Mar. 11, 2021. The entirety of the above-mentioned patent application is hereby incorporated by reference herein and made a part of this specification.

BACKGROUND

Technical Field

The disclosure relates to a device and method of manufacturing the same, and more particularly, to a semiconductor device and method of manufacturing the same.

Description of Related Art

Generally, a stack technology provides advantages not only of an increase performance but also in regards to mounting density and mounting area utilization efficiency. Due to such advantages, research and development of stack technology has accelerated, such as ongoing efforts to increase density, and reduce costs.

SUMMARY

The disclosure provides a method of manufacturing a semiconductor device including bonding a second device wafer to a first device wafer, such that a first bonding interface including a dielectric-to-dielectric bonding interface and a metal-to-metal bonding interface is formed between the first device wafer and the second device wafer, wherein the second device wafer is electrically coupled to the first device wafer, and the first device wafer and the second device wafer are the same kind of device wafer.

The disclosure provides a semiconductor device including a substrate, a first stacking unit, and a second stacking unit. The first stacking unit is disposed on the substrate and comprising a first dielectric layer and a first metal component. The second stacking unit is disposed on the first stacking unit and comprising a second dielectric layer and a second metal component. The first dielectric layer directly contacts the second dielectric layer, and a first metal component directly contacts a second metal component. The semiconductor device is homogeneous in functionality.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
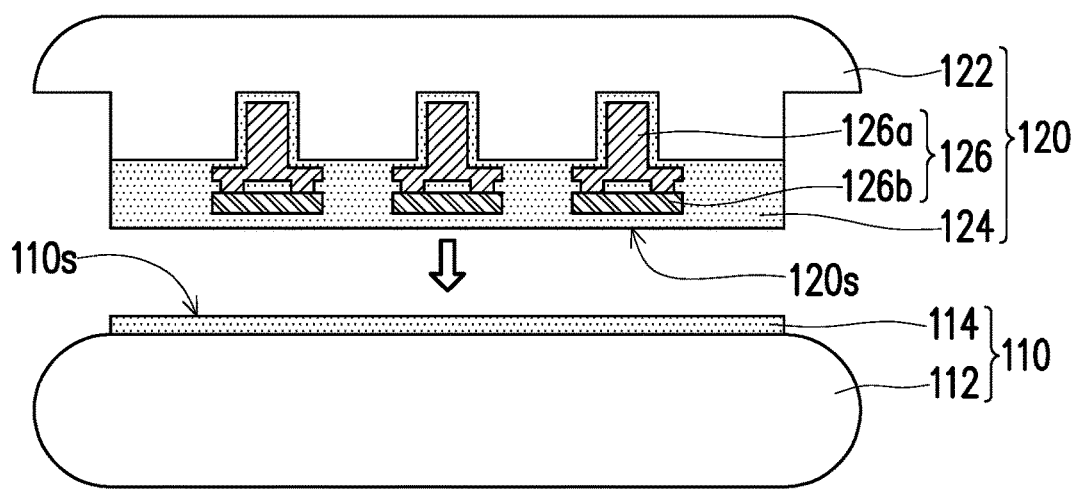
FIG. 1A to FIG. 1L are schematic cross sectional views illustrating various stages in a manufacturing method of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A to FIG. 1L are schematic cross sectional views illustrating various stages in a manufacturing method of a semiconductor device according to some embodiments of the disclosure.

Referring to FIG. 1A, in the present embodiment, a manufacturing process of a semiconductor device 100 may include the following steps. A dummy wafer 110 and a first device wafer 120 are provided. In some embodiments, the dummy wafer 110 may have no circuit pattern, but the disclosure is not limited thereto. In addition, the dummy wafer 110 may have a substrate 112 and a dielectric material layer 114 formed on the substrate 112, wherein the substrate 112 may include silicon or other suitable material, and the dielectric material layer 114 may include a dielectric material, such as silicon nitride, silicon oxide, silicon carbon nitride or a combination thereof by any suitable method, such as CVD, ALD, or the like, but the disclosure is not limited thereto.

On the other hand, the first device wafer 120 may be a memory device wafer, such as a DRAM or the like, but the disclosure is not limited thereto. In addition, the first device wafer 120 may include a first substrate 122, a first dielectric layer 124 extended from the first substrate 122, and at least one first connector 126 (three is shown but not limited) formed in the first substrate 122 and surrounded by the first dielectric layer 124 to avoid current leakage. The first substrate 122 may be a doped bulk silicon, an undoped bulk silicon, or an active layer of a semiconductor-on-insulator (SOI) substrate, and may include various layers that are not separately depicted and that combine to form various microelectronic elements, doped regions and isolation features, not shown. The first dielectric layer 124 may include a dielectric material, such as silicon nitride, silicon oxide, silicon carbon nitride or a combination thereof by any suitable method, such as CVD, ALD, or the like, but the disclosure is not limited thereto. Moreover, the first connector 126 may include a through-silicon via (TSV) 126a and a conductive pad 126b formed on the through-silicon via (TSV) 126a, wherein the through-silicon via (TSV) 126a and the conductive pad 126b are embedded in the first dielectric layer 124, such that only dielectric surface (a surface of the first dielectric layer 124) is exposed, but the disclosure is not limited thereto. In some embodiments, the through-silicon via (TSV) 126a includes copper (Cu) or other suitable material, and the conductive pad 126b includes aluminum (Al) or other suitable material, but the disclosure is not limited thereto.

In some embodiments, the through-silicon via (TSV) 126a is formed by the via-middle process. In here, a definition of the via-middle process such as the forming of the through-silicon via (TSV) 126a is performed after the transistor formation and before the BEOL operations, but the disclosure is not limited thereto. In addition, the through-silicon via (TSV) 126a is formed through via etching operation, and then via hole is filled with conductive materials through electroplating operation (not shown), but the disclosure is not limited thereto, the through-silicon via (TSV) 126a may be formed by other suitable process. Furthermore, a critical diameter (CD) of the through-silicon via (TSV) 126a may be substantially 3 micrometers, and a depth of the through-silicon via (TSV) 126a may be substantially 10 micrometers, but the disclosure is not limited thereto, based on the design requirements, the through-silicon via (TSV) 126a may have any suitable size.

In some embodiments, for decreasing the breakage at the edge of substrate in the subsequent processes, a trimming process may be applied. For example, the trimming process is performed on the first substrate 122 to adjust a shape of the edge, therefore, the stress accumulated on a corner of the first substrate 122 will reduce in the subsequent processes, but the disclosure is not limited thereto.

Figure 1B:
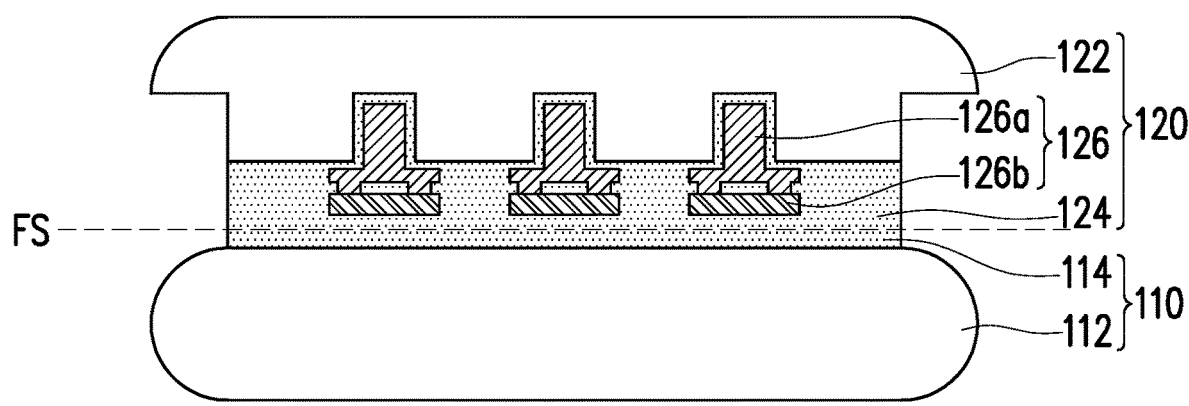

Referring to FIG. 1A and FIG. 1B, bonding the first device wafer 120 to the dummy wafer 110, such that a bonding interface FS including a dielectric-to-dielectric bonding interface is formed between the dummy wafer 110 and the first device wafer 120. Moreover, the dummy wafer 110 may direct contact the first device wafer 120. For example, the bonding interface FS is formed by a fusion-bonding process, the dielectric material layer 114 forms a fusion bond with the first dielectric layer 124, that is, the dielectric material layer 114 directly contacts the first dielectric layer 124, and no metal contact between the dummy wafer 110 and the first device wafer 120, but the disclosure is not limited thereto.

In fusion bonding process, a surface of the dielectric layer is smooth and clean, therefore, before the fusion-bonding process, a polishing process or a cleaning process may be applied. For example, the cleaning process performs a wet clean to activate a surface 110s of the dummy wafer 110 and a surface 120s of the first device wafer 120 to form the hydrophilic surface and to clean the surface of the surface 110s (bonding surface) and the surface 120s (bonding surface), such as a metal particle or an impurity existing on the surface 110s and/or the surface 120s are removed, therefore, a bonding reliability will be improve, but the disclosure is not limited thereto.

In some embodiments, the material of the dielectric material layer 114 and the material of the first dielectric layer 124 are used the same material, such as oxide, therefore, bonding interface FS is formed by oxide to oxide bond, but the disclosure is not limited thereto. In some embodiments, the material of the dielectric material layer 114 and the material of the first dielectric layer 124 are not used the same material, for example, the material of the dielectric material layer 114 may use oxide, and the material of the first dielectric layer 124 may use nitride, but the disclosure is not limited thereto.

Figure 1C:
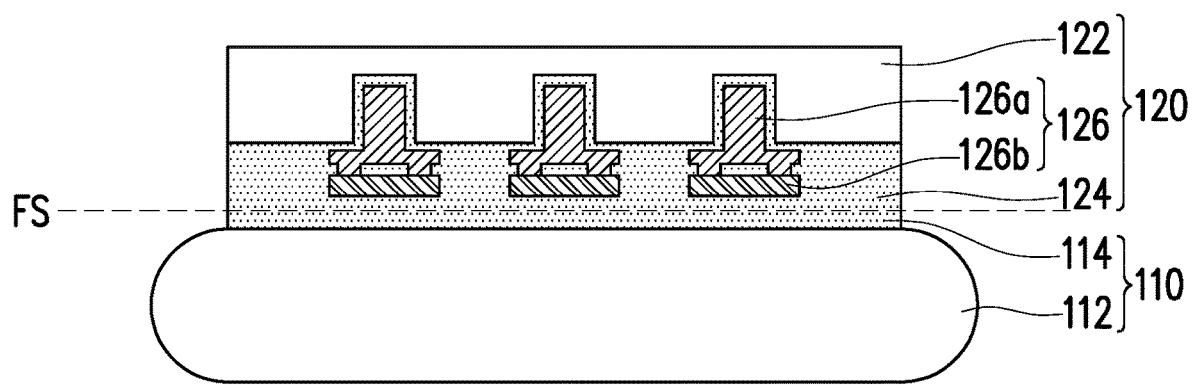
Figure 1D:
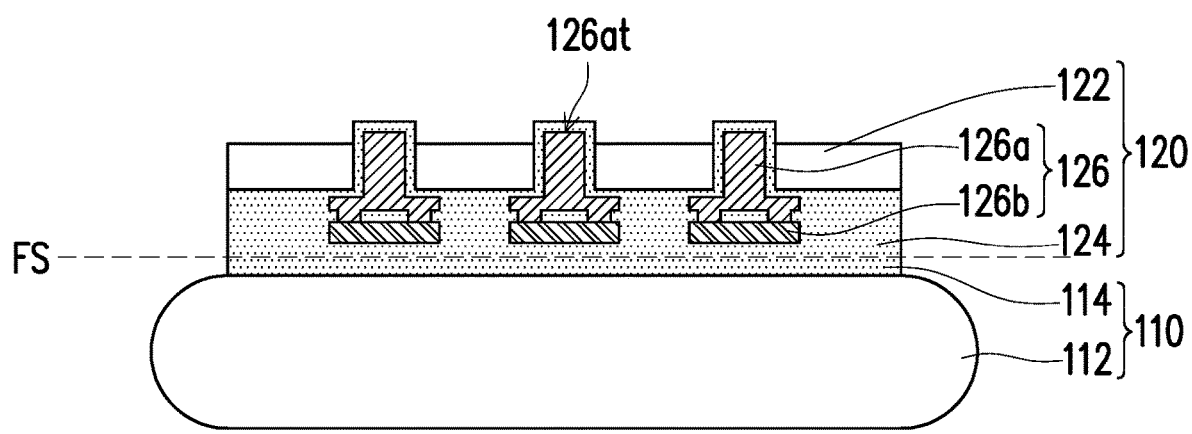

Referring to FIG. 1C to FIG. 1F, the first connector 126 of the first device wafer 120 may be revealed by the following steps for subsequent electrical connection. First, a first portion of the first substrate 122 is removed, as shown in FIG. 1C. In this step, when the grinding process may be applied to remove the first portion of the first substrate 122, after removing, the first connector 126 is still embedded in the first substrate 122, in other words, the first connector 126 may be not exposed. Then, a second portion of the first substrate 122 is removed, as shown in FIG. 1D. In this step, an etching process may be applied for removing the second portion of the first substrate 122 precisely, therefore, a problem of a height difference of a plurality of first connectors 126 may be solved, but the disclosure is not limited thereto. In here, the etching process may have a etch selection ratio for the first substrate 122 and the first dielectric layer 124, therefore, the second portion of the first substrate 122 may be removed precisely. Accordingly, a bottom 126at of the through-silicon via (TSV) 126a surrounded by the first dielectric layer 124 of the first connector 126 is revealed, in other words, the first substrate 122 is recessed below the bottom 126at of the through-silicon via (TSV) 126a surrounded by the first dielectric layer 124 of the first connector 126.

It should be note that although the first substrate 122 of the first device wafer 120 may be removed at two steps in aforementioned process, but the disclosure is not limited thereto, number of steps is based on the design requirements, for example, one step, three steps, or over than three steps may be used.

Figure 1E:
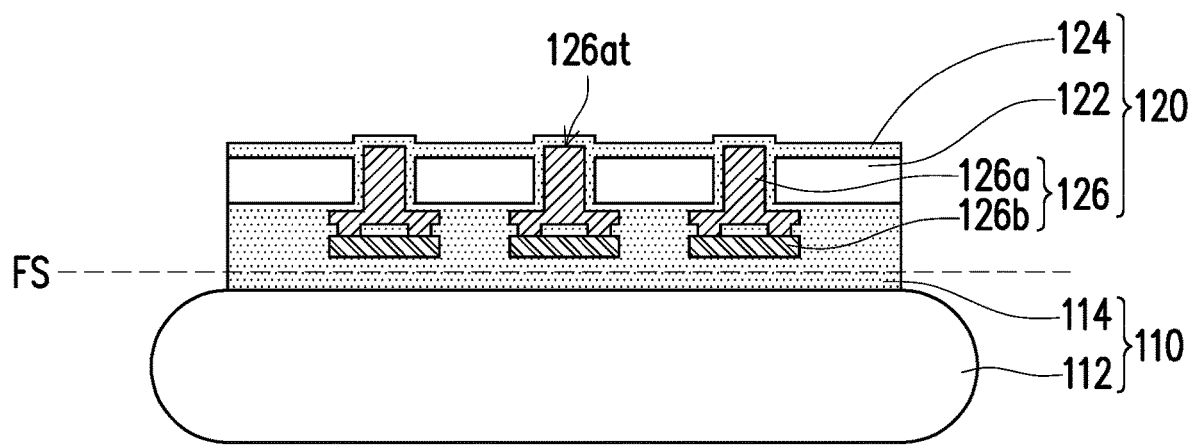
Figure 1F:
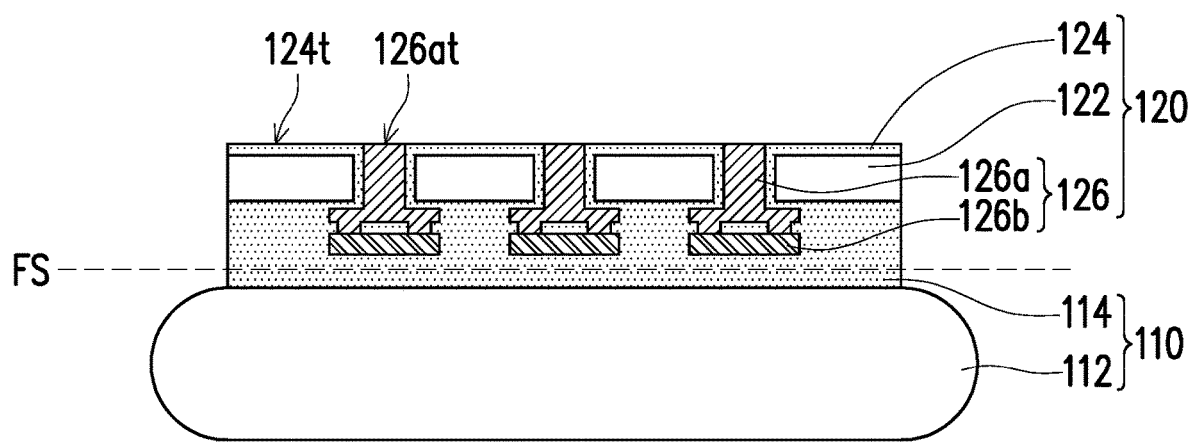

Then, a dielectric material is formed on the first device wafer 120, for example, the dielectric material is formed on remaining first substrate 122 and beside the bottom 126at of through-silicon via (TSV) 126a surrounded by the first dielectric layer 124, as shown in FIG. 1E, such that the dielectric material regrowth the first dielectric layer 124 to totally cover the remaining first substrate 122 and the bottom 126at of through-silicon via (TSV) 126a surrounded by the first dielectric layer 124. Next, a planar process is performed on a backside of the first device wafer 120, such that the first connector 126 is revealed, as shown in FIG. 1F. For example, the bottom 126at of through-silicon via (TSV) 126 is revealed, such that the bottom 126at of through-silicon via (TSV) 126a and a surface 124t of the first dielectric layer 124 are coplanar, but the disclosure is not limited thereto. In here, the planar process may include CMP process or other suitable process. It should be note that, the disclosure is not limited thereto, the first device wafer 120 may use other suitable method to reveal the first connector 126.

Figure 1G:
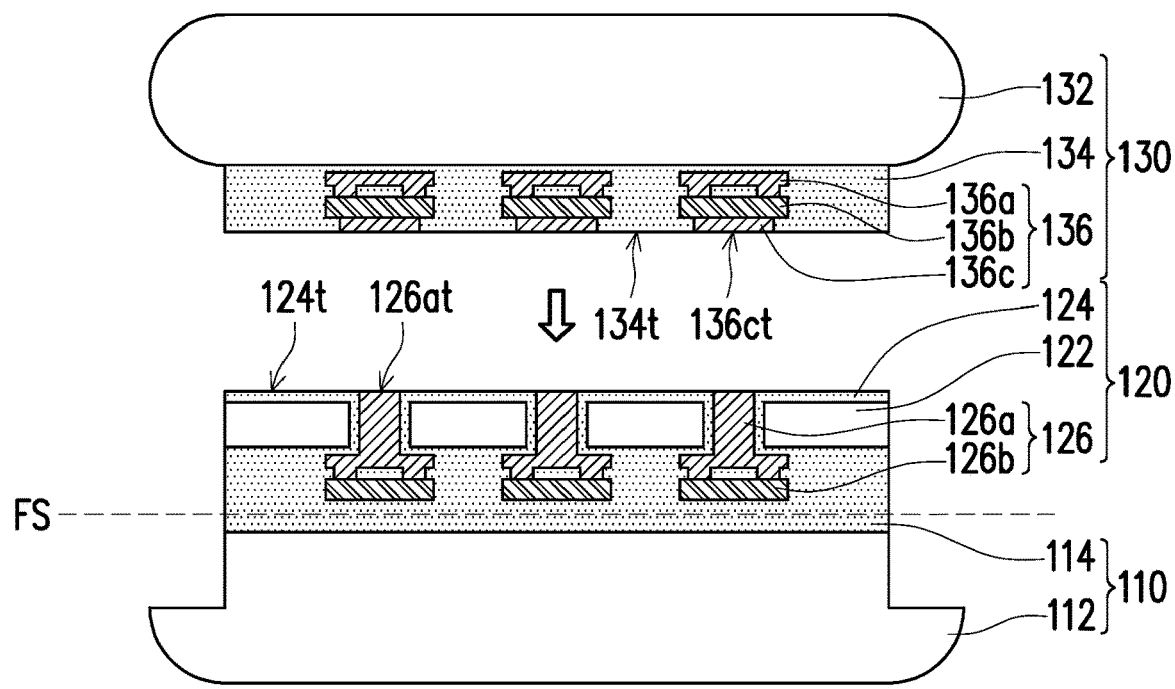

Referring to FIG. 1G, a second device wafer 130 is provided. The second device wafer 130 may be a memory device wafer, such as a DRAM or the like, in other words, the first device wafer 120 and the second device wafer 130 are the same kind of device wafer, such that the first device wafer 120 and the second device wafer 130 may be homogeneous in functionality. In addition, the second device wafer 130 may include a second substrate 132, a second dielectric layer 134 formed on the second substrate 132, and at least one second connector 136 (three is shown but not limited) formed on the second substrate 132 and embedded in the second dielectric layer 134. The second substrate 132 may be a doped bulk silicon, an undoped bulk silicon, or an active layer of a semiconductor-on-insulator (SOI) substrate, and may include various layers that are not separately depicted and that combine to form various microelectronic elements, doped regions and isolation features, not shown. The second dielectric layer 134 may include a dielectric material, such as silicon nitride, silicon oxide, silicon carbon nitride or a combination thereof by any suitable method, such as CVD, ALD, or the like, but the disclosure is not limited thereto. Moreover, the second connector 136 may include a conductive pattern 136a, a conductive pad 136b formed on the conductive pattern 136a, and conductive terminal 136c formed on the conductive pad 136b, wherein the conductive pattern 136a, the conductive pad 136b, and the conductive terminal 136c are surrounded by the second dielectric layer 134, and the conductive pattern 136a, the conductive pad 136b, and the conductive terminal 136c can use suitable process to form, for example, the conductive terminal 136c may use pad open process and the plating process formed on the conductive pad 136b. Furthermore, a surface 136ct of the conductive terminal 136c and a surface 134t of the second dielectric layer 134 are coplanar, such that dielectric surface (the surface 134t of the second dielectric layer 134) and conductive surface (the surface 136ct of the conductive terminal 136c) are exposed, but the disclosure is not limited thereto. In some embodiments, the conductive pattern 136a and the conductive terminal 136c include copper (Cu) or other suitable material, and the conductive pad 136b includes aluminum (Al) or other suitable material, but the disclosure is not limited thereto.

Figure 1H:
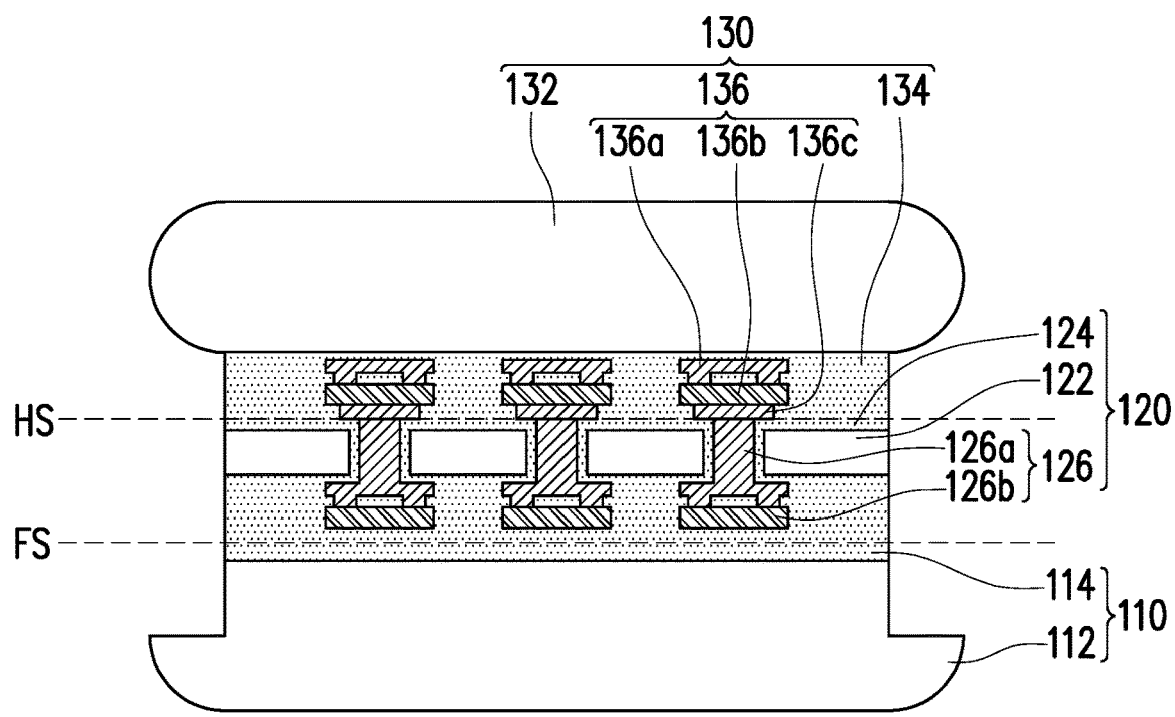

Referring to FIG. 1G and FIG. 1H, bonding a second device wafer 130 to the first device wafer 120, such that a bonding interface HS including a dielectric-to-dielectric bonding interface and a metal-to-metal bonding interface is formed between the first device wafer 120 and the second device wafer 130, and the second device wafer 130 is electrically coupled to the first device wafer 120. Moreover, the second device wafer 130 may be directly contact the first device wafer 120. For example, the bonding interface HS is formed by a hybrid-bonding process, the first dielectric layer 124 may directly contact second dielectric layer 134, and the first connector 126 may directly contact the second connector 136, but the disclosure is not limited thereto. The term "hybrid" refers to the formation of the two different types of bonds using a single bonding process, rather than forming only one type of bond, as is the practice in other types of wafer-to-wafer bonding processes, for example.

In some embodiments, for decreasing the breakage at the edge of substrate in the subsequent processes, a trimming process may be applied. For example, the trimming process is performed on the substrate 112 of the dummy wafer 110 to adjust a shape of the edge, therefore, the stress accumulated on a corner of the substrate 112 of the dummy wafer 110 will reduce in the subsequent processes, but the disclosure is not limited thereto.

In some embodiments, the material of the first dielectric layer 124 and the material of the second dielectric layer 134 are used the same material, such as oxide, and the first connector 126 and the second connector 136 are used the same material, such as metal, therefore, bonding interface HS is formed by oxide to oxide bond and metal to metal bond, but the disclosure is not limited thereto. In some embodiments, the material of the first dielectric layer 124 and the material of the second dielectric layer 134 are not used the same material, and the first connector 126 and the second connector 136 are not used the same material, but the disclosure is not limited thereto.

Figure 1I:
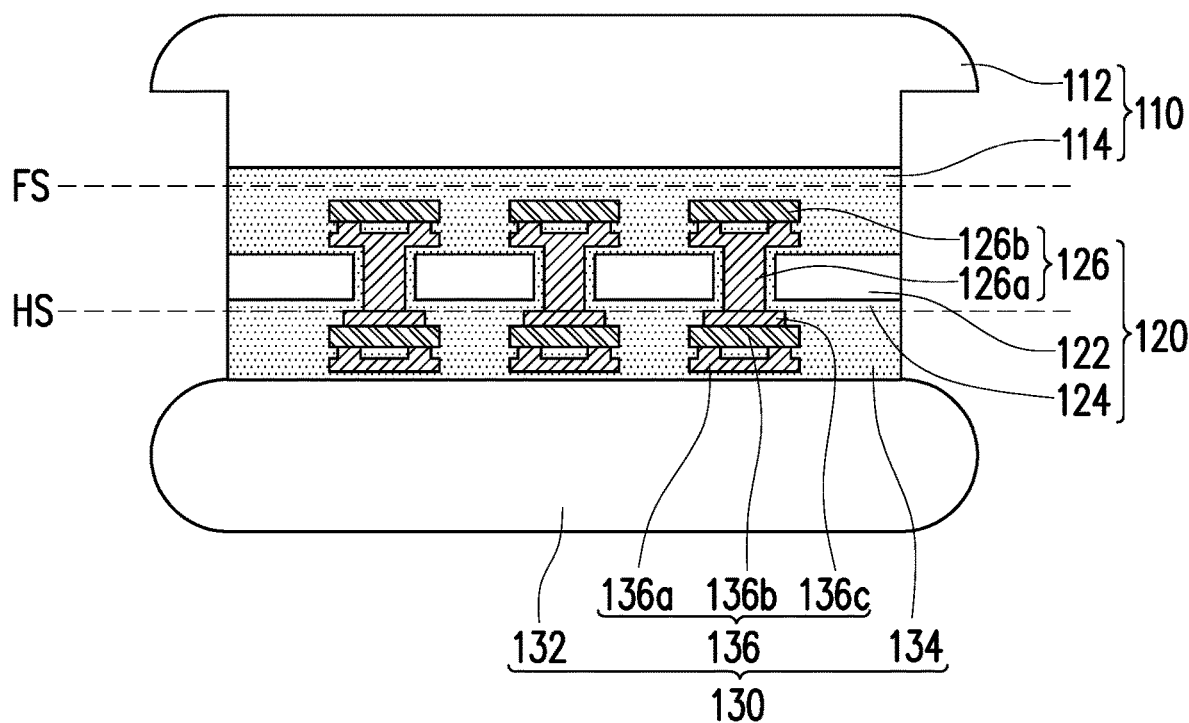
Figure 1J:
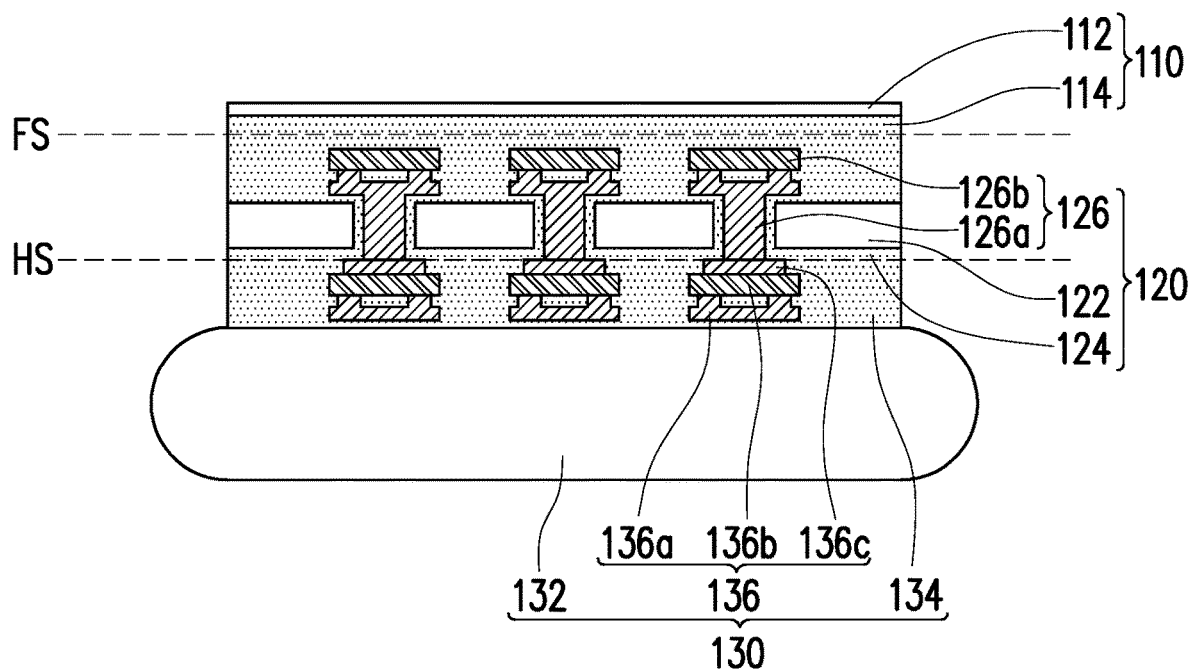
Figure 1K:
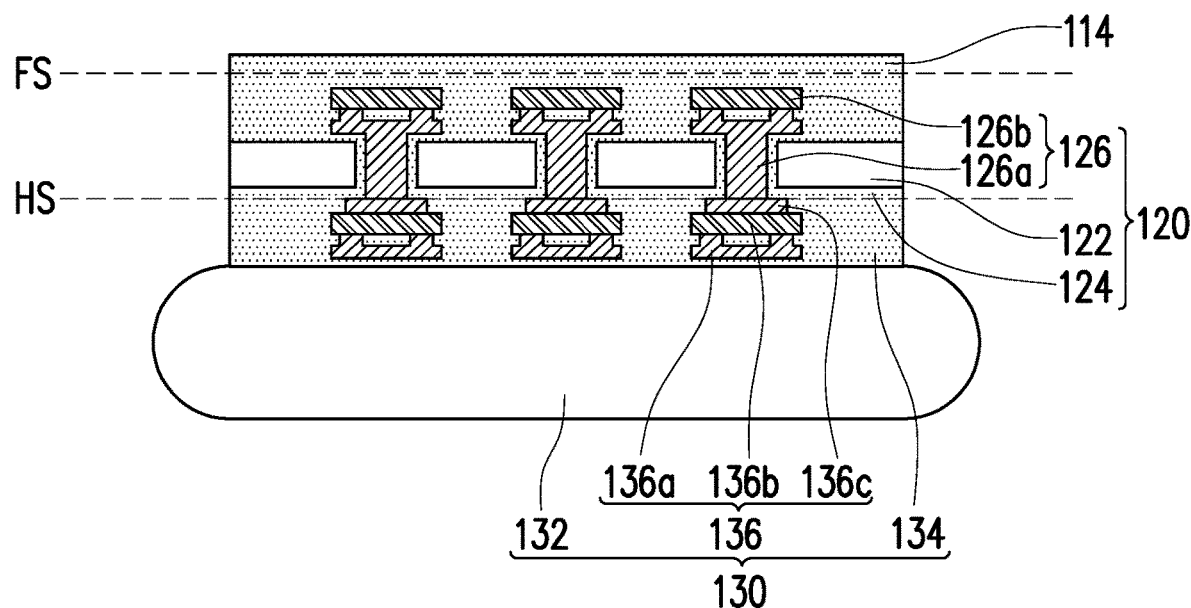

Referring to FIG. 1I to FIG. 1K, after the bonding interface HS is formed, the structure shown in FIG. 1H is flipped upside down, as shown in FIG. 1I. Then, the substrate 112 of the dummy wafer 110 is removed by the following steps. First, a first portion of a substrate 112 is removed, as shown in FIG. 1J. In this step, when the grinding process may be applied to remove the first portion of the substrate 112, after removing, the substrate 112 may not be removed totally, in other words, the dielectric material layer 114 may be not exposed. Then, a second portion of the substrate 112 is removed, as shown in FIG. 1K. In this step, an etching process may be applied for removing the second portion of the substrate 112 precisely, but the disclosure is not limited thereto. In here, the etching process may have a etch selection ratio for the substrate 112 and the dielectric material layer 114, therefore, the second portion of the substrate 112 may be removed totally and precisely, and the dielectric material layer 114 may be exposed.

Figure 1L:
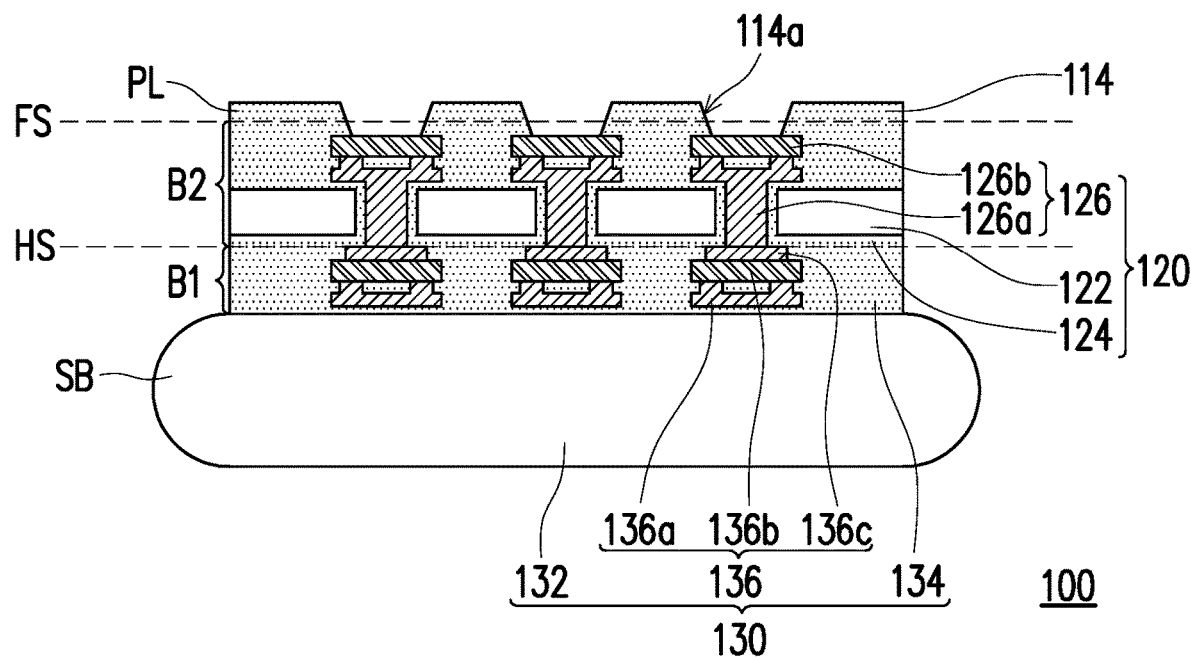

Referring to FIG. 1L, after the substrate 112 of the dummy wafer 110 is removed, an opening 114a is formed in the dielectric material layer 114, wherein the conductive pad 126b is exposed by the opening 114a, therefore, the conductive pad 126b may be electrically connected another conductive component (such as solder ball or wire), but the disclosure is not limited thereto. The manufacture of the semiconductor device 100 of the embodiment may be substantially completed after the above manufacturing process. The semiconductor device 100 includes a substrate SB, a first stacking unit B1 and a second stacking unit B2. The first stacking unit B1 is disposed on the substrate SB and including a dielectric layer (such as second dielectric layer 134) and a metal component (such as conductive terminal 136c). The second stacking unit B2 is disposed on the first stacking unit B1 and including a dielectric layer (such as first dielectric layer 124) and a metal component (such as through-silicon via (TSV) 126a). Moreover, a dielectric layer (such as second dielectric layer 134) of first stacking unit B1 directly contacts a dielectric layer (such as first dielectric layer 124) of second stacking unit B2, and a metal component (such as conductive terminal 136c) of the first stacking unit B1 directly contacts a metal component (such as through-silicon via (TSV) 126a) of second stacking unit B2, wherein semiconductor device 100 is homogeneous in functionality. In here, the substrate SB is based on the second substrate 132, the first stacking unit B1 is based on second dielectric layer 134, and second connector 136 (conductive pattern 136a, conductive pad 136b, and the conductive terminal 136c), and the second stacking unit B2 is based on first substrate 122, first dielectric layer 124, and first connector 126 (through-silicon via (TSV) 126a and conductive pad 126b).

Accordingly, in aforementioned process at least including bonding a second device wafer 130 to a first device wafer 120, such that a bonding interface HS including a dielectric-to-dielectric bonding interface and a metal-to-metal bonding interface is formed between the first device wafer 120 and the second device wafer 130, that is, no de-bonding layer (temporary layer) between the dummy wafer 110 and the first device wafer 120 and a plurality of processes (such as de-bonding process, flipped upside down process and micromump bonding process) are omitted, on the other hand, a thickness of the device wafer may be decrease to increase density of the semiconductor device 100 (z-height of product), such that the costs are reduced, and favorable electrical performance and reliability of the high-density semiconductor device 100 are guaranteed. In some embodiments, the thickness of the every device wafer may be smaller than 10 micrometer, but the disclosure is not limited thereto.

In some embodiments, the semiconductor device 100 may be a memory stack, such as a DRAM stack, but the disclosure is not limited thereto.

Moreover, the metal component (such as conductive terminal 136c) of first stacking unit B1 is aligned with the metal component (such as through-silicon via (TSV) 126a) of second stacking unit B2, in other words, an orthographic projection of the metal component (such as conductive terminal 136c) of first stacking unit B1 on the substrate SB and an orthographic projection of the metal component (such as through-silicon via (TSV) 126a) of second stacking unit B2 on the substrate SB are overlap, and the metal component (such as conductive terminal 136c) of first stacking unit B1 and the metal component (such as through-silicon via (TSV) 126a) of second stacking unit B2 are vertical stacked, hence, the semiconductor device 100 may have short vertical connecting route to improve the performance, but the disclosure is not limited thereto.

In some embodiments, the metal component (such as through-silicon via (TSV) 126a) is penetrated through the first substrate 122 to form a vertical interconnection of the semiconductor device 100, but the disclosure is not limited thereto.

In present embodiment, the semiconductor device 100 further comprising a passivation layer PL disposed on the second stacking unit B2, and the passivation layer PL may be directly contacts the dielectric layer (such as dielectric layer 124) of second stacking unit B2, but the disclosure is not limited thereto. In here, passivation layer PL is based on the dielectric material layer 114.

It should be noted herein that the reference numerals of components and some contents in the foregoing embodiments also apply in the following embodiments, where the same reference numerals are used to denote the same or similar components, and the descriptions of the same technical contents are omitted. For the description of the omitted part, reference can be made to the foregoing embodiments, and the details are not described in the following embodiments again.

FIG. 2A to FIG. 2F are schematic cross sectional views illustrating various stages in a manufacturing method of a semiconductor device according to some embodiments of the disclosure. The semiconductor device 200 of this embodiment is similar to the semiconductor device 100 of the first embodiment, in which similar elements are denoted by the same reference numerals and are assumed to have similar functions, materials or forming methods, so the descriptions thereof are omitted hereinafter.

Figure 2A:
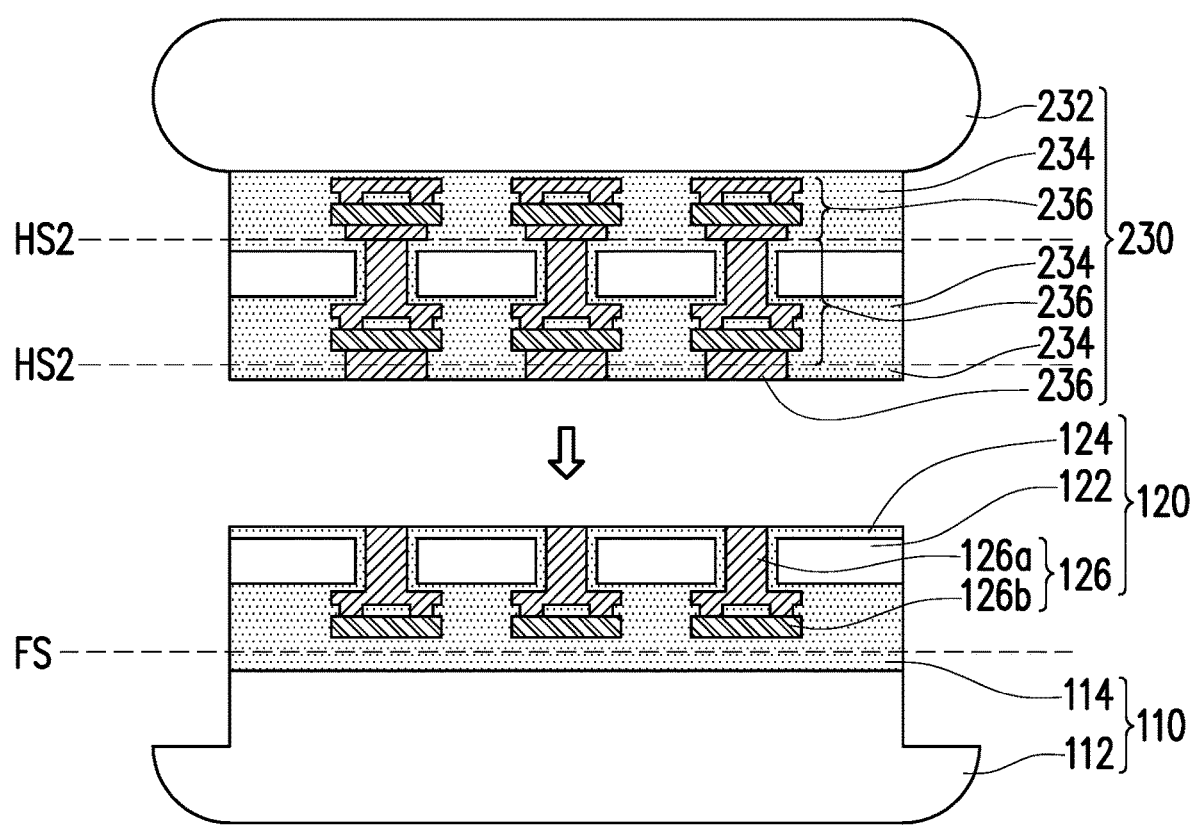
FIG. 2A to FIG. 2F are schematic cross sectional views illustrating various stages in a manufacturing method of a semiconductor device according to some embodiments of the disclosure.

Referring to FIG. 2A, following the step of FIG. 1F, a second device wafer 230 is provided. The second device wafer 230 may be a memory device wafer, such as a DRAM or the like, in other words, the first device wafer 120 and the second device wafer 230 are the same kind of device wafer, such that the first device wafer 120 and the second device wafer 230 may be homogeneous in functionality. In addition, the second device wafer 230 may include a second substrate 232, a plurality of second dielectric layers 234 (three is shown but not limited) formed on the second substrate 232, and a plurality of second connectors 236 (three is shown but not limited) embedded in the plurality of second dielectric layers 234. The second substrate 232 may be a doped bulk silicon, an undoped bulk silicon, or an active layer of a semiconductor-on-insulator (SOI) substrate, and may include various layers that are not separately depicted and that combine to form various microelectronic elements, doped regions and isolation features, not shown, the second dielectric layer 234 may include a dielectric material, such as silicon nitride, silicon oxide, silicon carbon nitride or a combination thereof by any suitable method, such as CVD, ALD, or the like, but the disclosure is not limited thereto. Moreover, the second connector 236 may include through-silicon via (TSV), conductive pad, conductive pattern and conductive terminal similar to aforementioned components, the descriptions are omitted.

In present embodiment, the second device wafer 230 includes a bonding interface HS2 between two adjacent second dielectric layers 234 and two adjacent second connectors 236, and the second bonding interface HS2 including a dielectric-to-dielectric bonding interface and a metal-to-metal bonding interface. Furthermore, the bonding interface HS2 is formed by a hybrid-bonding process, but the disclosure is not limited thereto.

Figure 2B:
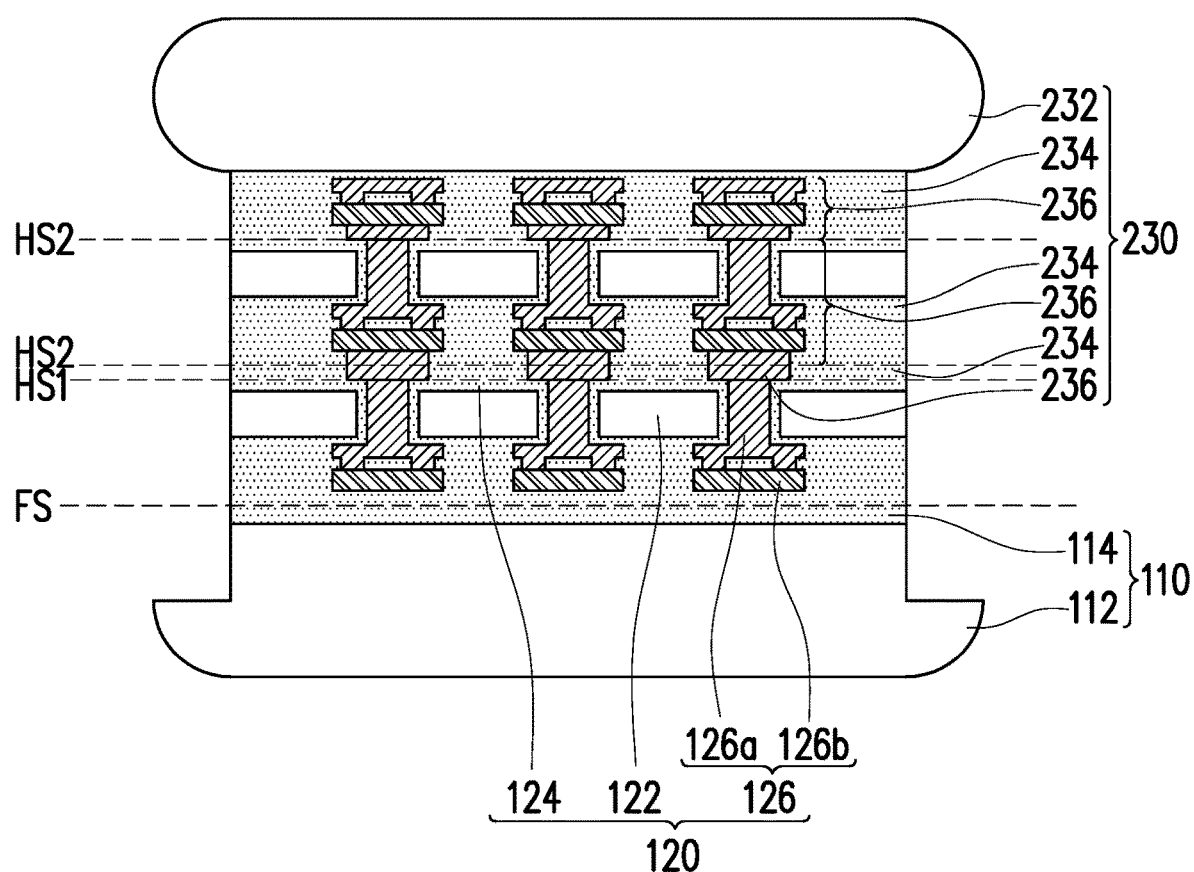

Referring to FIG. 2A and FIG. 2B, bonding a second device wafer 230 to the first device wafer 120, such that a bonding interface HS1 including a dielectric-to-dielectric bonding interface and a metal-to-metal bonding interface is formed between the first device wafer 120 and the second device wafer 230, and the second device wafer 230 is electrically coupled to the first device wafer 120. In addition, the first bonding interface HS1 may be formed between the first dielectric layer 124, the first connector 126, a closest second dielectric layer 234 and a closest second connector 236, but the disclosure is not limited thereto.

In some embodiments, for decreasing the breakage at the edge of substrate in the subsequent processes, a trimming process may be applied. For example, the trimming process is performed on the substrate 112 of the dummy wafer 110 to adjust a shape of the edge, therefore, the stress accumulated on a corner of the substrate 112 of the dummy wafer 110 will reduce in the subsequent processes, but the disclosure is not limited thereto.

In some embodiments, the material of the first dielectric layer 124 and the material of the second dielectric layer 234 are used the same material, such as oxide, and the first connector 126 and the second connector 236 are used the same material, such as metal, therefore, bonding interface HS is formed by oxide to oxide bond and metal to metal bond, but the disclosure is not limited thereto. In some embodiments, the material of the first dielectric layer 124 and the material of the second dielectric layer 234 are not used the same material, and the first connector 126 and the second connector 236 are not used the same material, but the disclosure is not limited thereto.

Figure 2C:
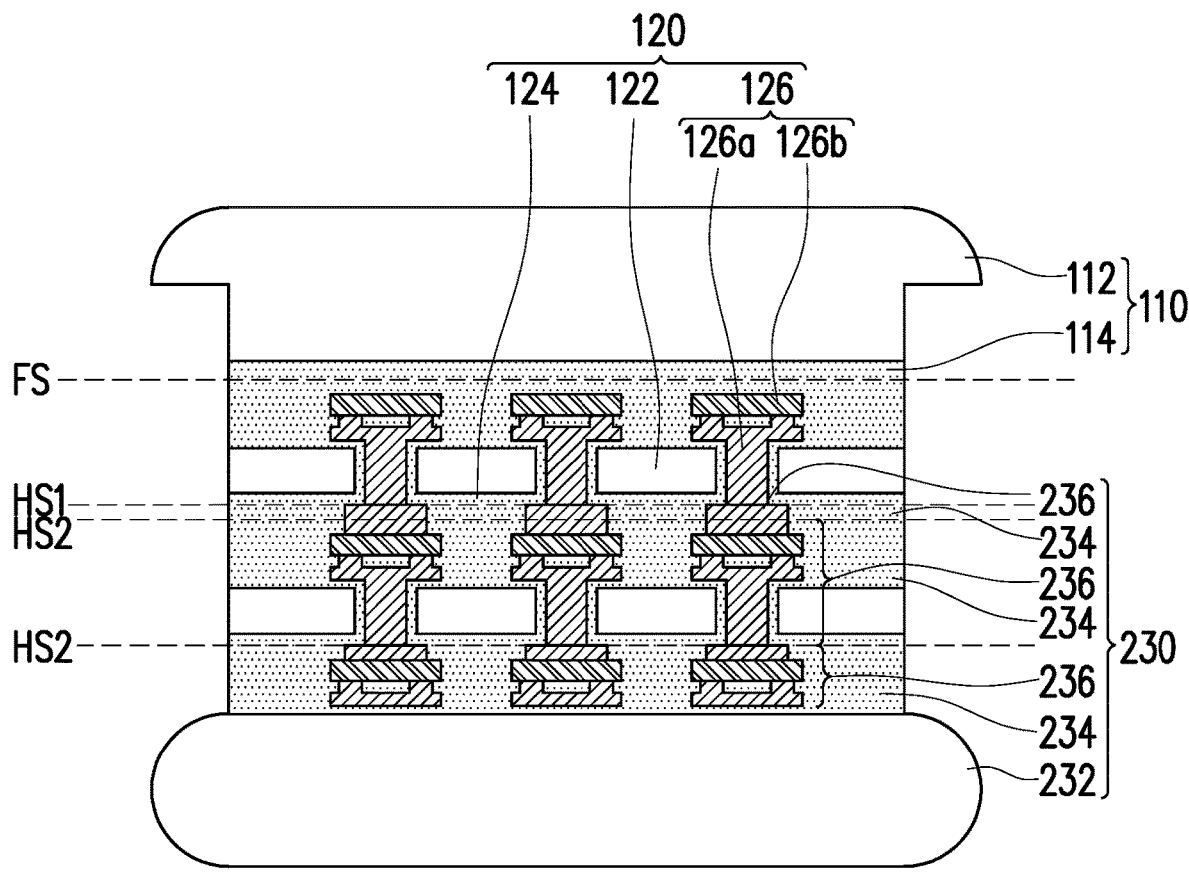
Figure 2D:
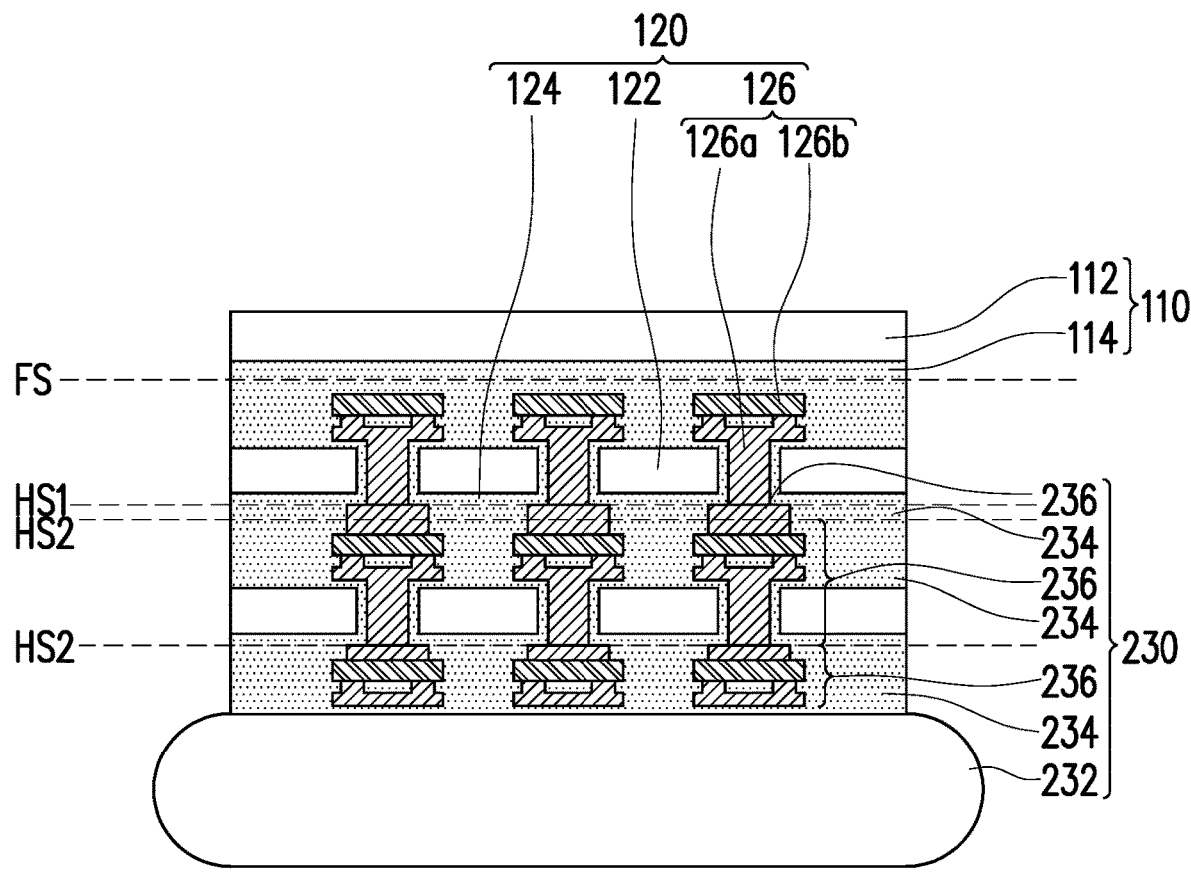
Figure 2E:
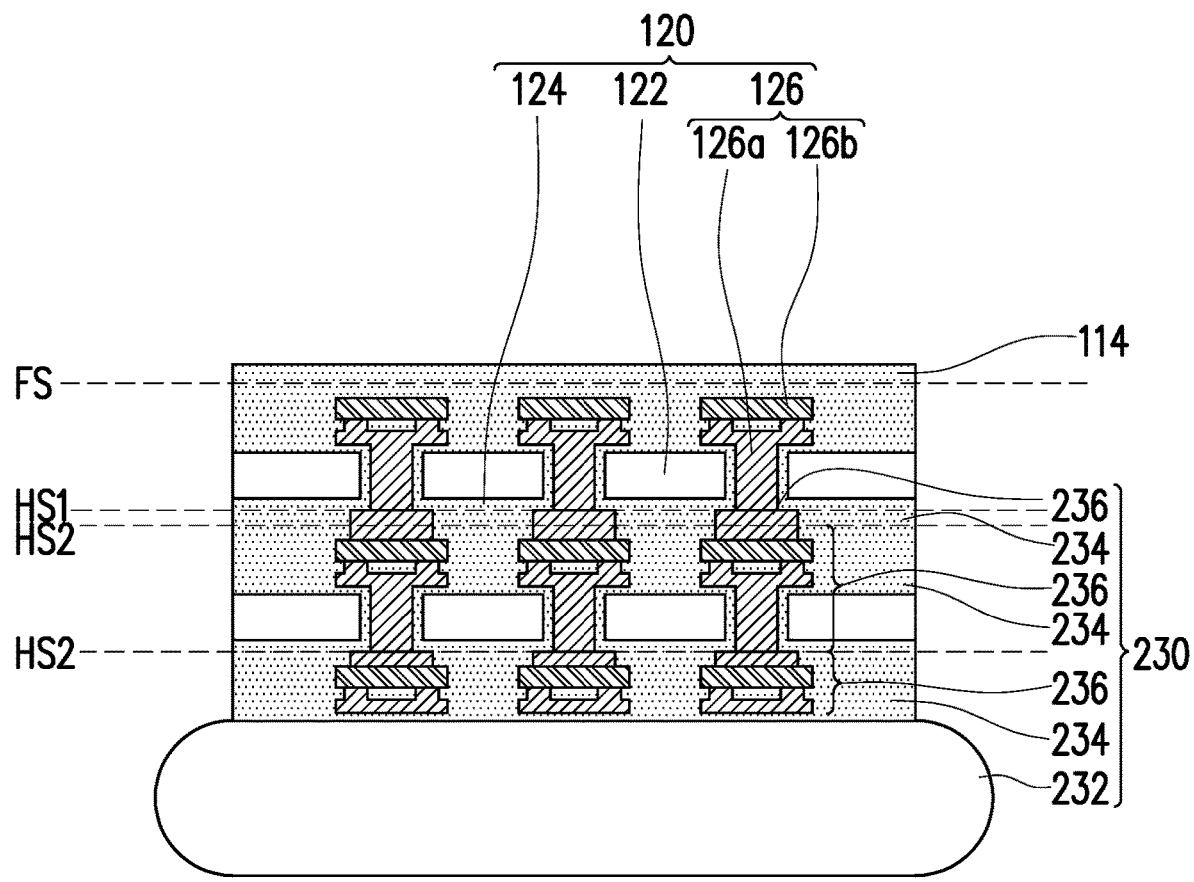

Referring to FIG. 2C to FIG. 2E, after the bonding interface HS is formed, the structure shown in FIG. 2B is flipped upside down, as shown in FIG. 2C. Then, the substrate 112 of the dummy wafer 110 is removed by the following steps. First, a first portion of a substrate 112 is removed, as shown in FIG. 2D. In this step, when the grinding process may be applied to remove the first portion of the substrate 112, after removing, the substrate 112 may not be removed totally, in other words, the dielectric material layer 114 may be not exposed. Then, a second portion of the substrate 112 is removed, as shown in FIG. 2E. In this step, an etching process may be applied for removing the second portion of the substrate 112 precisely, but the disclosure is not limited thereto. In here, the etching process may have a etch selection ratio for the substrate 112 and the dielectric material layer 114, therefore, the second portion of the substrate 112 may be removed totally and precisely, and the dielectric material layer 114 may be exposed.

Figure 2F:
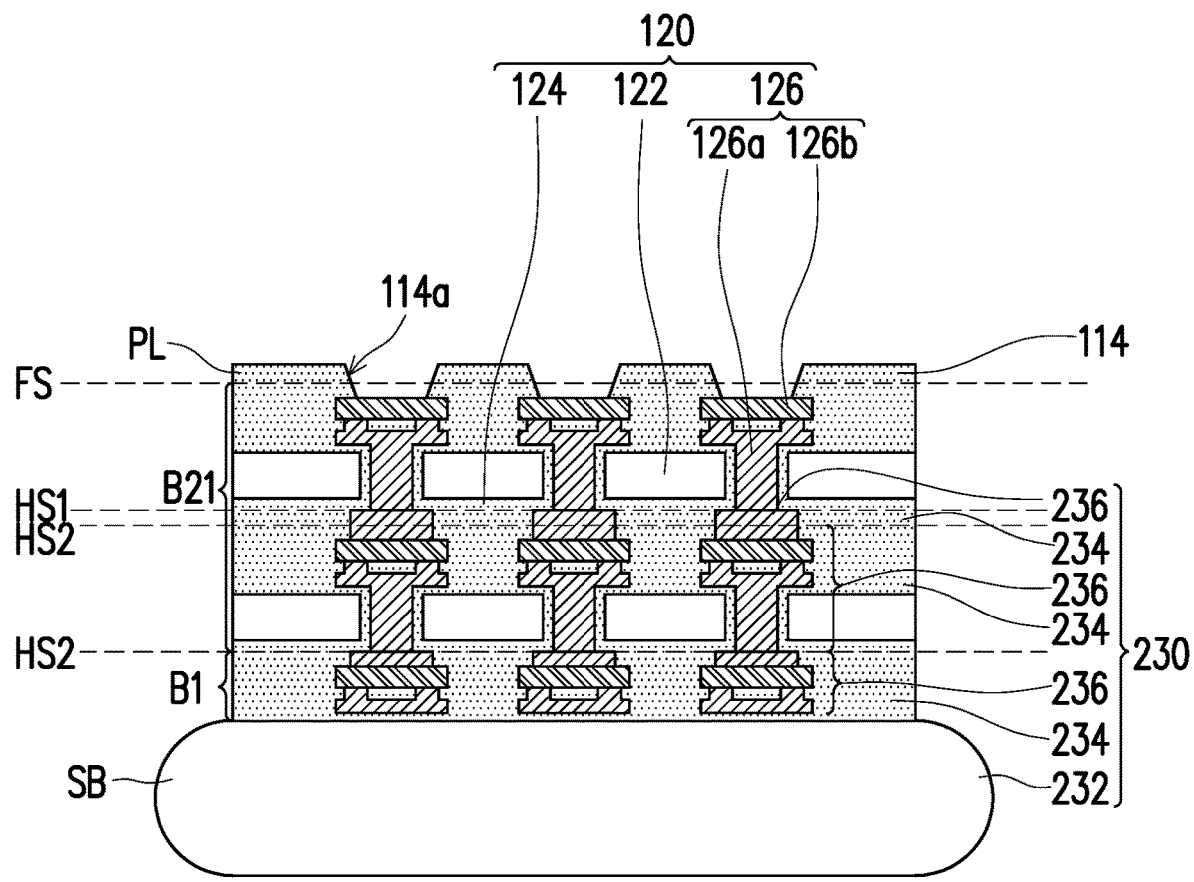

Referring to FIG. 2F, after the substrate 112 of the dummy wafer 110 is removed, an opening 114a is formed in the dielectric material layer 114, wherein the conductive pad 126b is exposed by the opening 114a to electrically connect another conductive component (such as solder ball or wire). The manufacture of the semiconductor device 200 of the embodiment may be substantially completed after the above manufacturing process. The semiconductor device 200 includes a substrate SB, a first stacking unit B1 and a second stacking unit B21. The first stacking unit B1 is disposed on the substrate SB and including a dielectric layer (such as second dielectric layer 234) and a metal component (such as second connector 236). The second stacking unit B2 is disposed on the first stacking unit B1 and including a dielectric layer (such as another second dielectric layer 234) and a metal component (such as another second connector 236). Moreover, the dielectric layer (such as second dielectric layer 234) of first stacking unit B1 directly contacts the dielectric layer (such as another second dielectric layer 234) of second stacking unit B2, and the metal component (such as second connector 236) of the first stacking unit B1 directly contacts the metal component (such as another second connector 236) of second stacking unit B2, wherein semiconductor device 200 is homogeneous in functionality. In here, the substrate SB is based on the second substrate 232, the first stacking unit B1 is based on second dielectric layer 234 and second connectors 236, and the second stacking unit B2 is based on first substrate 122, first dielectric layer 124 and first connector 126 (through-silicon via (TSV) 126a and conductive pad 126b) and the plurality of second dielectric layers 234 and the plurality of second connectors 236.

Accordingly, in aforementioned process at least including bonding a second device wafer 230 to a first device wafer 120, such that a bonding interface HS1 including a dielectric-to-dielectric bonding interface and a metal-to-metal bonding interface is formed between the first device wafer 120 and the second device wafer 230, that is, no de-bonding layer (temporary layer) between the dummy wafer 110 and the first device wafer 120 and a plurality of processes (such as de-bonding process, flipped upside down process and micro-mump bonding process) are omitted, on the other hand, a thickness of the wafer can be decrease to increase density of the semiconductor device 200 (z-height of product), such that the costs are reduced, and favorable electrical performance and reliability of the high-density semiconductor device 200 are guaranteed. In present embodiments, number of stack device wafer are more, therefore, the performance will improve, but the disclosure is not limited thereto, and it may repeat the aforementioned process to form a semiconductor device stacking more device wafer.

In some embodiments, the semiconductor device 200 may be a memory stack, such as a DRAM stack, but the disclosure is not limited thereto.

Moreover, the second stacking unit B21 includes at least two dielectric layers (such as second dielectric layers 234) and at least two second metal components (such as another second connector 236), two adjacent second dielectric layers (such as second dielectric layers 234) directly contacts each other, and two adjacent second metal components (such as another second connector 236) directly contacts each other.

In some embodiments, the at least two metal components (second connectors 236) of the second stacking unit B21 are aligned with the metal component (such as conductive terminal 136c) of first stacking unit B1, in other words, an orthographic projection of the at least two metal components (second connectors 236) of the second stacking unit B21 on the substrate SB and an orthographic projection of the metal component (such as conductive terminal 136c) of first stacking unit B1 on the substrate SB are overlap, and the at least two metal components (second connectors 236) of the second stacking unit B21 and the metal component (such as conductive terminal 136c) of first stacking unit B1 are vertical stack, hence, the semiconductor device 200 may have short vertical connecting route to improve the performance, but the disclosure is not limited thereto.

In present embodiment, the semiconductor device 200 further comprising a passivation layer PL disposed on the second stacking unit B21, and the passivation layer PL may be directly contacts the dielectric layer (such as first dielectric layer 124) of second stacking unit B21, but the disclosure is not limited thereto. In here, passivation layer PL is based on the dielectric material layer 114.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of manufacturing a semiconductor device, comprising:
   bonding a second device wafer to a first device wafer, such that a first bonding interface including a dielectric-to-dielectric bonding interface and a metal-to-metal bonding interface is formed between the first device wafer and the second device wafer, wherein the second device wafer is electrically coupled to the first device wafer, and the first device wafer and the second device wafer are the same kind of device wafer, the first bonding interface is formed by a hybrid-bonding process, and the hybrid-bonding process refers to the formation of the two different types of bonds using a single bonding process,
   bonding the first device wafer to a dummy wafer, wherein a third bonding interface including a dielectric-to-dielectric bonding interface is formed between the dummy wafer and the first device wafer before the first bonding interface is formed.

2. The method as claimed in claim 1, wherein the first device wafer directly contacts the second device wafer.

3. The method as claimed in claim 1, wherein the first device wafer comprises a first dielectric layer and a first connector embedded in the first dielectric layer, the second device wafer comprises a second dielectric layer and a second connector embedded in the second dielectric layer, the first dielectric layer directly contacts the second dielectric layer, and the first connector directly contacts the second connector.

4. The method as claimed in claim 3, wherein the second device wafer comprises a plurality of second dielectric layers and a plurality of second connectors embedded in the plurality of second dielectric layers, and the first bonding interface is formed between the first dielectric layer, the first connector, a closest second dielectric layer and a closest second connector.

5. The method as claimed in claim 1, wherein the dummy wafer directly contacts the first device wafer.

6. The method as claimed in claim 1, wherein the third bonding interface is formed by a fusion-bonding process.

7. The method as claimed in claim 1, wherein the dummy wafer comprises a dielectric material layer, the first device wafer comprises a first dielectric layer, and the dielectric material layer directly contacts the first dielectric layer.

* * * * *